United States Patent
Hsu et al.

(10) Patent No.: US 7,057,866 B2
(45) Date of Patent: Jun. 6, 2006

(54) SYSTEM AND METHOD FOR DISCONNECTING A PORTION OF AN INTEGRATED CIRCUIT

(75) Inventors: Louis L. Hsu, Fishkill, NY (US); Rajiv V. Joshi, Yorktown Heights, NY (US); Chorng-Lii Hwang, Wappinger Falls, NY (US); Toshiaki K. Kirihata, Poughkeepsie, NY (US); Paul C. Parries, Wappinger Falls, NY (US)

(73) Assignee: International Business Machines Corp., Armonk, NY (US)

(*) Notice: Subject to any disclaimer, the term of this patent is extended or adjusted under 35 U.S.C. 154(b) by 0 days.

(21) Appl. No.: 09/929,591

(22) Filed: Aug. 14, 2001

(65) Prior Publication Data

US 2003/0034825 A1     Feb. 20, 2003

(51) Int. Cl.
    *G11C 8/00*    (2006.01)
(52) U.S. Cl. .......................................... 361/18; 365/226
(58) Field of Classification Search ........ 361/100–104, 361/18, 86, 87, 91.1, 111; 365/200, 201, 365/226, 227, 229
    See application file for complete search history.

(56) References Cited

U.S. PATENT DOCUMENTS

| | | | | |
|---|---|---|---|---|
| 5,388,084 A | * | 2/1995 | Itoh et al. | 365/185.23 |
| 5,444,412 A | * | 8/1995 | Kowalski | 327/541 |
| 5,946,257 A | * | 8/1999 | Keeth | 365/226 |
| 6,337,595 B1 | * | 1/2002 | Hsu et al. | 327/538 |
| 6,343,044 B1 | * | 1/2002 | Hsu et al. | 365/227 |
| 6,411,157 B1 | * | 6/2002 | Hsu et al. | 327/536 |
| 6,496,027 B1 | * | 12/2002 | Sher et al. | 324/763 |
| 6,629,291 B1 | * | 9/2003 | Houghton et al. | 716/1 |
| 6,737,907 B1 | * | 5/2004 | Hsu et al. | 327/536 |

OTHER PUBLICATIONS

*256-Mb DRAM Circuit Technologies for File Applications*, IEEE Journal of Solid-State Circuits, vol. 28, No. 11, Nov. 1993, pp. 1105-1113.

* cited by examiner

*Primary Examiner*—Brian Sircus
*Assistant Examiner*—Danny Nguyen
(74) *Attorney, Agent, or Firm*—Satheesh K. Karra, Esq.

(57) ABSTRACT

An integrated circuit system having a plurality of macros is provided. The integrated circuit system includes an external voltage supply input configured for supplying an external voltage to the integrated circuit; and a plurality of internal voltage supply generators, each of the plurality of internal voltage supply generators being connected to a respective macro of the plurality of macros and configured for receiving the external voltage via the external voltage supply input for generating an internal voltage supply for operating its respective macro. Each of the plurality of internal voltage supply generators includes circuitry for generating the internal voltage supply and circuitry for disconnecting at least a portion of its respective macro. The integrated circuit system can be applied to a semiconductor chip to save active or stand-by power. It can also be used to disconnect a defective portion of the chip and optionally replace it with a non-defective portion of the chip.

15 Claims, 5 Drawing Sheets

SYSTEM AND METHOD FOR DISCONNECTING A PORTION OF AN INTEGRATED CIRCUIT

FIELD OF THE INVENTION

The present invention relates the field of integrated circuit (IC) design. More particularly, it relates to a system and method for disconnecting or isolating a designated portion of an integrated circuit, either permanently or temporarily.

BACKGROUND OF THE INVENTION

As integration levels of integrated circuits expand, semiconductor chip size has continuously increased, and accordingly, each chip may contain a plurality of macros. These macros may be of similar functionality, such as memory arrays (i.e., DRAMs), or of differing functionality, such as mixed digital and analog macros. The production yield of these chips can be greatly improved if extra, or redundant, macros are prepared.

An article entitled "256-Mb DRAM Circuit Technologies for File Applications" in the IEEE Journal of Solid State Circuits, vol. 28, no. 11, November 1993, pp. 1105–1113, discusses the effect that chip integration has had on chip yield. FIG. 1 is a chart taken from the article showing the ratio of these different faults for each generation of DRAM technology. As shown in FIG. 1, the trend indicates as the integration level has progressed, the fatal fault and excessive stand-by current fault (Isb fault) over-dominates the traditional bit and line fault.

To improve chip yield, several redundancy schemes have been employed to overcome the Isb fault. One such scheme is to remove a power supply to a defective macro on the chip. For example, one can design a power switch for each macro, so when the macro is found to be defective, the power switch is turned off and the supply power to the macro is cut-off. However, this scheme requires a large area of the integrated circuit chip to form a low impedance switch. Additionally, when the switch is large, it is vulnerable and subject to off-state leakage. On the other hand, if the switch is not properly sized, the impedance could hurt the circuit performance.

The above-mentioned article suggests a sub-array replacement redundancy scheme, as shown in FIG. 2, employing a power switch and fuse ROM. In this scheme, all sub-arrays of a macro are tested one by one concerning DC current. The fuse ROMs are used to store the test results and control the switches. The power switches of the defective sub-arrays are turned off and the power switches for the good spare sub-arrays are turned on.

Another well-known prior art scheme is to use "header" and "footer" devices to selectively switch on and off a portion of a circuit, i.e., a defective macro. Similar to the power switch scheme, this approach is not area efficient. Besides, it consumes energy to switch on and off the huge header and footer devices.

Another approach is to provide an array of laser, or electrical, fuses between an external power supply and the macro power supply system. An array of fuses is needed in order to avoid high impedance occurrences in the power supply. When a macro must be disabled, the whole array of fuses is blown using conventional blowing techniques. Due to the ablative nature of fuse blowing techniques, this scheme is not a clean process. For example, sometimes, the remaining debris could form an unwanted high resistive path, especially when blowing a full array of fuses located in close proximity to each other. Unlike signal fuse blowing, this scheme is not a fully reliable method. Besides, this is a non-reversible process, once the macro is blown, it cannot be reconnected to the power supply.

SUMMARY

Accordingly, it is an aspect of the present invention to provide a system and method for selectively disconnecting a designated portion of an integrated circuit, either permanently or temporarily, without affecting normal operation of the integrated circuit.

Another aspect of the present invention is to provide a DC voltage generator system for disconnecting a designated portion of an integrated circuit.

It is a further aspect of the present invention to provide a DC voltage generator system for disconnecting a defective macro of an integrated circuit to eliminate cross-macro noise coupling and voltage leakage.

Finally, another aspect of the present invention is to provide a DC voltage generator system for disconnecting a designated portion of an integrated circuit where the designated portion is capable of being reconnected at a later time due to a need in increased capacity or to replace other failed portions.

Accordingly, the present invention provides an integrated circuit system having a plurality of macros. The integrated circuit system includes an external voltage supply input configured for supplying an external voltage to the integrated circuit; and a plurality of internal voltage supply generators, each of the plurality of internal voltage supply generators being connected to a respective macro of the plurality of macros and configured for receiving the external voltage via the external voltage supply input for generating an internal voltage supply for operating its respective macro. Each of the plurality of internal voltage supply generators includes circuitry for generating the internal voltage supply and circuitry for disconnecting at least a portion of its respective macro. The integrated circuit system can be applied to a semiconductor chip to save active or stand-by power. It can also be used to disconnect a defective portion of the chip and optionally replace it with a non-defective portion of the chip.

According to the integrated circuit system of the present invention, any unwanted portion(s) of the integrated circuit system (i.e., a grossly defective macro, a macro with excessive stand-by current due to local power short, and/or an unnecessary macro based on the current application) which can not be fixed by the on-chip redundancy elements are made detachable from the rest of the system. For example, during testing, if a macro is found to have a high level of DC leakage, the whole macro is disconnected from the rest integrated circuit system by removing the power supply to that macro so that the leakage problem due to any cause can be eliminated. Thereafter, once the defective macro is disconnected, one of a predetermined number of extra macros can be enabled so the remaining memory capacity can still meet customer's specifications.

The integrated circuit system of the present invention, which will be described below in detail, has many advantages: (1) the internal power supply is regulated; (2) any macro or sub-macro can be disconnected from the power supply temporarily or permanently, whether they are defective or not for power saving purposes; (3) any macro or sub-macro can be reconnected back to the power supply, if more macros are needed for different applications for flexibility; (4) the system is fully compatible with an ASIC (Application Specific Integrated Circuit) environment, that is during power-on, the unwanted or defective macros can be programmed to be shut-off by scanning a disable command into each macro; (5) each macro can be sequentially or parallelly tested during a test mode, thus saving test cost; (6) cross-macro noise coupling is eliminated, since the power supply to each macro is isolated from the rest of the macros; and (7) the DC voltage leakage associated with an off-state DC voltage generator is much lower than the prior art power switch scheme.

DETAILED DESCRIPTION OF THE INVENTION

Figure 3:
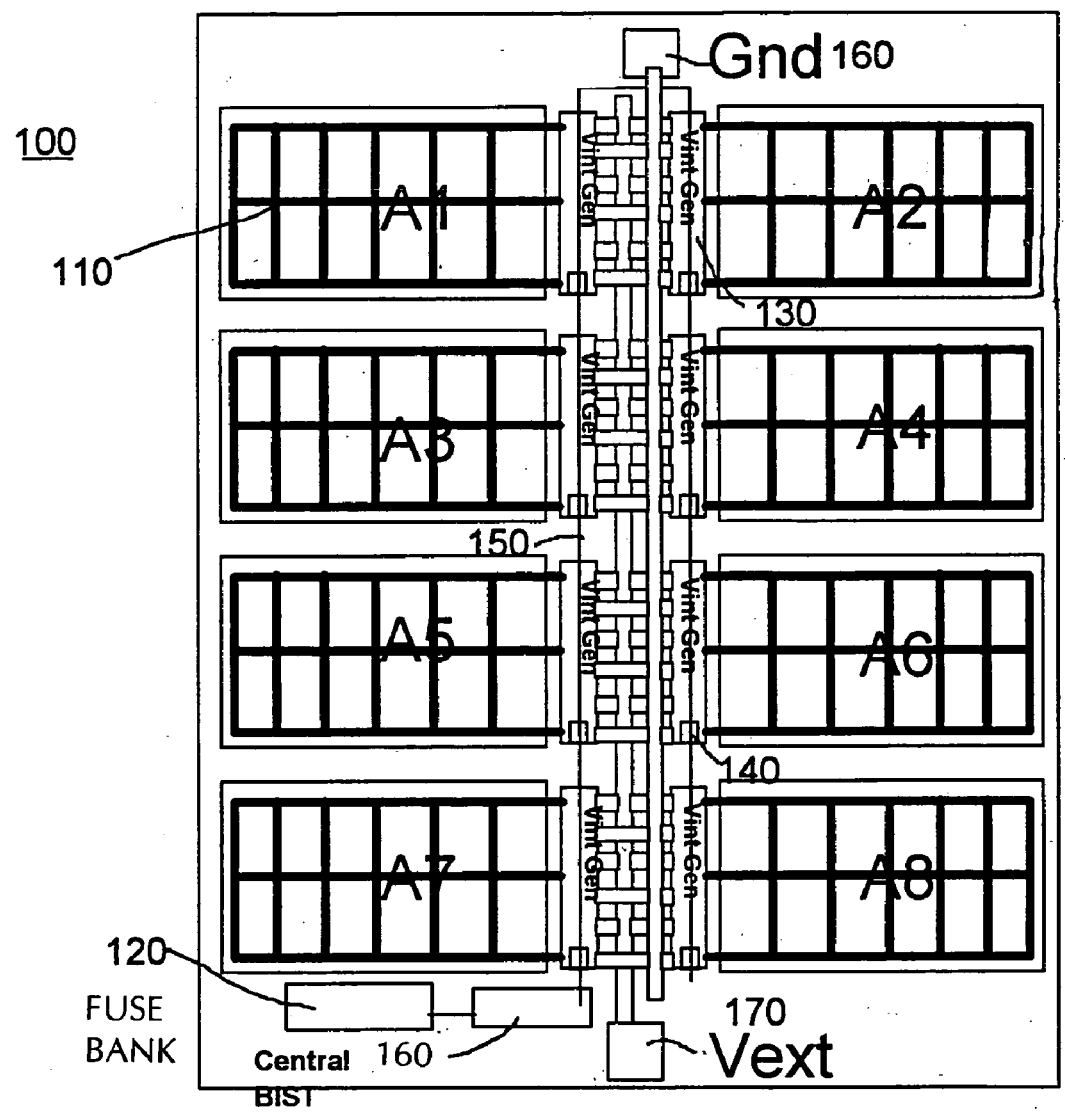
FIG. 3 is a block diagram of an integrated circuit system in accordance with the present invention having eight identical macros.

With reference to FIG. 3, there is shown an integrated circuit system 100 for selectively disconnecting or isolating a designated portion of the system in accordance with the present invention. By way of example, FIG. 3 illustrates an exemplary integrated circuit chip system comprising eight identical macros A1–A8, in which each macro is preferably an independently executable embedded DRAM. Based on the maturity of the design and technology stage, it will be assumed that two extra macros are sufficient for replacing up to two defective macros.

The integrated circuit system 100 of the present invention includes an external power supply Vext 170 and a global ground Gnd 160 which are connected to each macro A1–A8 via a set of properly sized power bus lines. Each macro A1–A8 is equipped with its own internal voltage supply generator 130 (Vint Gen). This internal voltage supply generator 130 receives an external power supply and generates an internal power supply In a preferred embodiment, the external power supply level is greater than the internal power supply level.

The internal voltage supply generator 130 also provides a voltage supply to generate other voltage levels, such as the boosted wordline high level Vpp, the negative word line level Vwl, and the substrate bias level Vbb, etc. (see FIG. 4). The generated and regulated Vint power supply network 110 of each macro A1–A8 is isolated from each other, therefore, cross-macro noise coupling can be minimized. The Vint power supply network 110 provides the generated internal power supply level, e.g., a voltage supply, to individual circuits and/or components, such as sense amplifier circuits, row and column decoders, etc., within each macro A1–A8 during operation.

The internal voltage supply generator 130 not only generates the internal power supply level, but also regulates the internal power supply level. As chips grow bigger, the internal power regulation of the internal voltage supply generator 130 becomes very critical in order to guarantee circuit performance. Such a local regulation will avoid any detrimental consequence caused by supply voltage instability either due to RC drop or noise effects.

Within each internal voltage supply generator 130, there is a switching mechanism which can switch the generator 130 on and off. This switching mechanism and the related DC system components within each macro A1–A8 will be discussed below with reference to FIG. 5. To control the switching mechanism, a scan-chain 150 formed by a chain of scannable enable registers 140 is provided. During a power-up period for the chip, fuse information, which determines row and column redundancy replacement, and a switch enable/disable signal, i.e., a logic high or logic low value, are scanned and stored in the corresponding latches 140 of each macro A1–A8. When power-up is over, the chip is ready for a normal operation and, for those macros A1–A8 which are disabled by the system, i.e., for example, a logic low enable signal is stored within their corresponding latch 140, their internal voltage supply generator 130 is disabled, and therefore, no power is generated to these macros A1–A8. Accordingly, these macros A1–A8 will be isolated, or disconnected, from the rest of the macros A1–A8.

Figure 4:
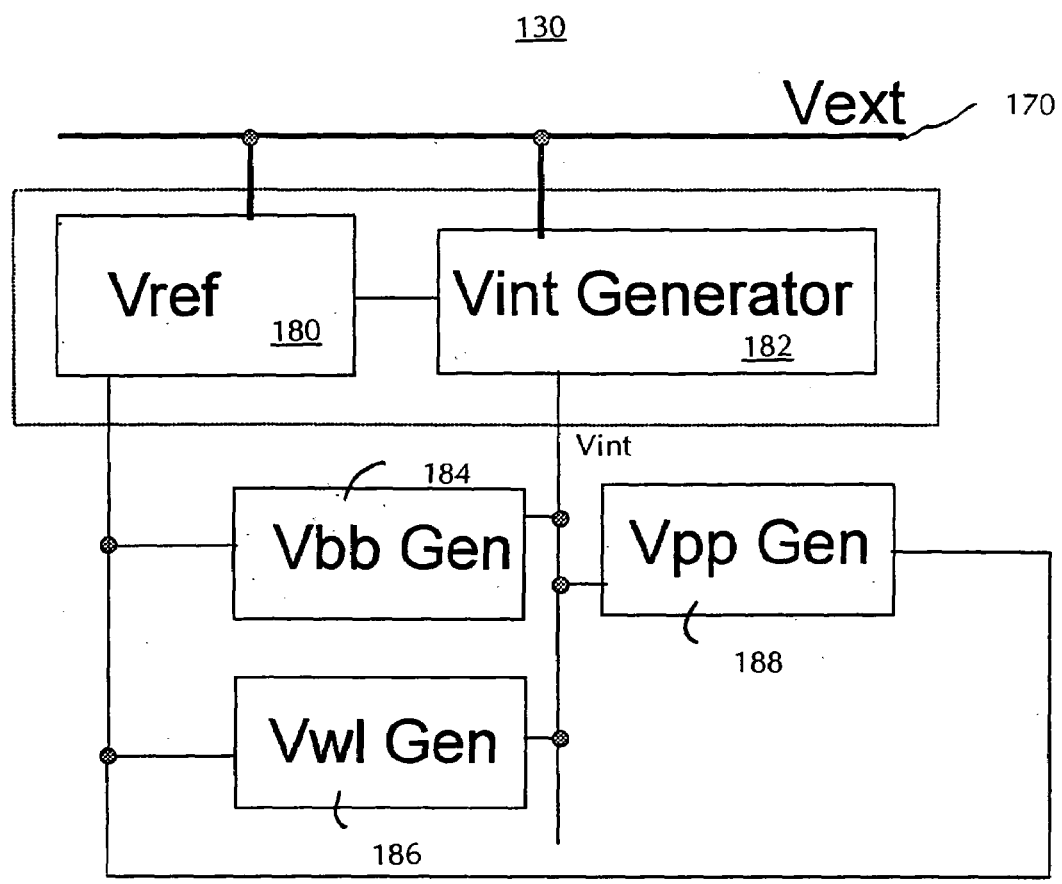
FIG. 4 is a block diagram of an internal voltage supply generator of the integrated circuit system in accordance with the present invention.

An exemplary internal voltage supply generator 130 for each macro A1–A8 is shown in FIG. 4. First, the external power supply Vext 170 generates a reference voltage level, e.g. a DC reference or band-gap reference, through reference voltage generator 180. These reference voltage levels are used to first generate an internal voltage supply Vint via Vint generator 182. Depending on the layout and power demand, a plurality of Vint generators 182 may be provided. Through the generated internal voltage supply Vint and reference voltage Vref, many other voltage levels, such as the substrate bias level Vbb, the negative word line level Vwl, and the boosted wordline high level Vpp are generated via the respective generators Vbb Gen 184, Vwl Gen 186, and Vpp Gen 188. Therefore, when the Vint generator 182 is switched off, the rest of the generators 184, 186, 188 will also stop functioning, and the power supply to the respective macro A1–A8 will be completely off.

Figure 5:
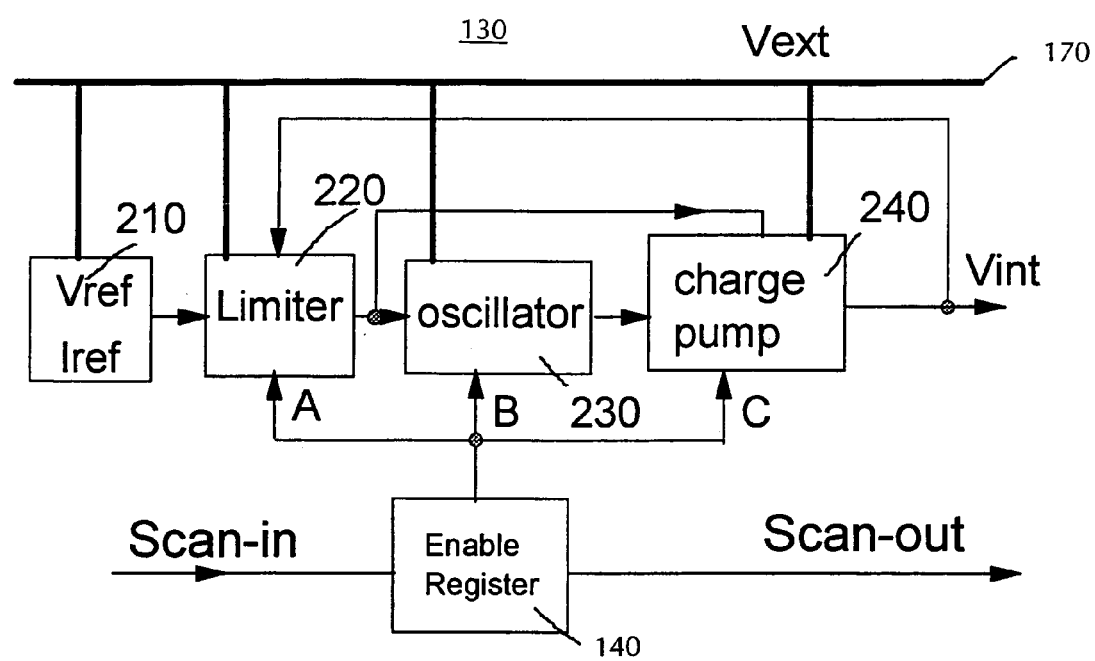
FIG. 5 is a detailed block diagram of the internal voltage supply generator of FIG. 4.

A more detailed block diagram of the internal voltage supply generator 130 is shown in FIG. 5. The internal voltage supply generator 130 includes a voltage and/or current reference supply unit 210 which can be identical to the voltage reference generator 180. The reference levels of reference supply unit 210 can be produced from a bandgap reference whose value is independent of temperature, process, and power supply level as is known in the art. The reference levels can also be a voltage and/or temperature dependent voltage or current reference level depending on the design requirements. The internal voltage supply generator 130 further includes voltage limiter 220, an oscillator 230, a charge pump 240 having at least one reservoir capacitor (not shown) and the enable register 140.

The voltage and current reference levels are fed into the voltage limiter 220 to control an output voltage level. The voltage limiter 220 includes a voltage divider and a differential amplifier, as is known in the art, for limiting or controlling the voltage or current reference levels generated by the reference supply unit 210. Based on the feedback voltage level of Vint and the reference voltage level, the differential amplifier determines whether the oscillator 230 and the charge pump 240 should be turned on or off.

Once the oscillator 230 is turned on, it generates an oscillating voltage level for pumping or driving the charge pump circuit 240 to generate the internal voltage supply level Vint. Note that all the components 210, 220, 230, 240 and 140 are powered by the external power supply Vext 170.

During power-up, the information that is scanned and stored in the enable register 140 determines whether the internal voltage supply generator 130 should be disabled or not. If a low state signal (disable signal) is stored in the register 140, then it automatically switches off the voltage limiter 220, the oscillator 230, and the charge pump 240 by transmitting a disable signal via control lines A, B and C, respectively, which form the switching mechanism discussed above.

At this point, the Vint generator 130 is completely turned off, and there is no floating state within these circuits. Accordingly, the Vint generator 130 is disconnected or isolated from the external voltage supply On the other hand, if a high state signal (enable signal) is stored in register 140, the voltage limiter 220, the oscillator 230, and the charge pump 240 are activated by an enable signal via control lines A, B and C and an internal power supply is provided to the corresponding macro A1–A8.

Once the internal voltage supply generator 130 is turned off, the leakage of the external power supply Vext 170 through the DC components are much lower than that of conventional power switches. This is due to the fact that the total device size for the voltage limiter 220, the oscillator 230, and the charge pump 240 is much smaller than that of a power switch. Typically, in order to avoid power loss due to a power switch, the switch is made large or is a wide channel device. Consequently, the wider the channel width, the higher the subthreshold current and subsequent leakage.

The integrated circuit system 100 of the present invention can disconnect any macro from the rest of the system for at least two reasons: (1) the macros are known to be defective. The defective macro addresses are recorded in a fuse bank 120 (see FIG. 3), and the fuse information is used to disable these macros, so that during normal operation theses macros are isolated or disconnected from the integrated circuit system; and (2) in order to save power. For example, during a low-power mode, less than the total number of macros may be needed to store only mission critical information. When less than the total number of macros is used, chip power consumption can be significantly reduced.

Figure 1:
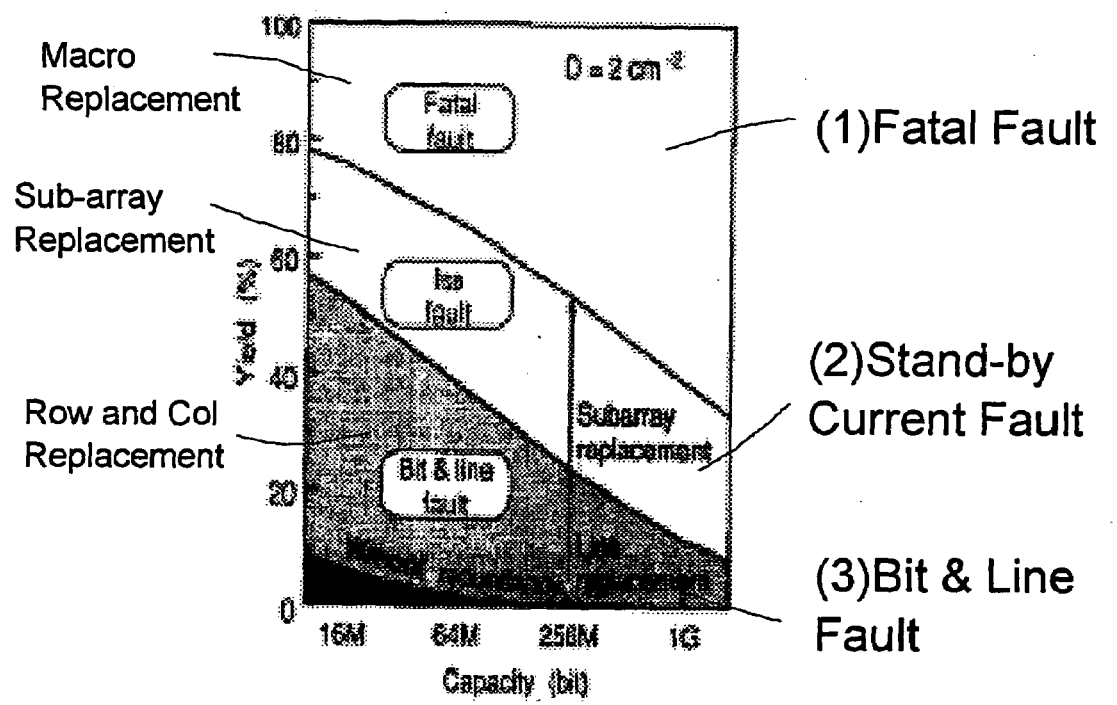
FIG. 1 is a chart illustrating yield improvement of DRAM chips through redundancy techniques.
Figure 2:
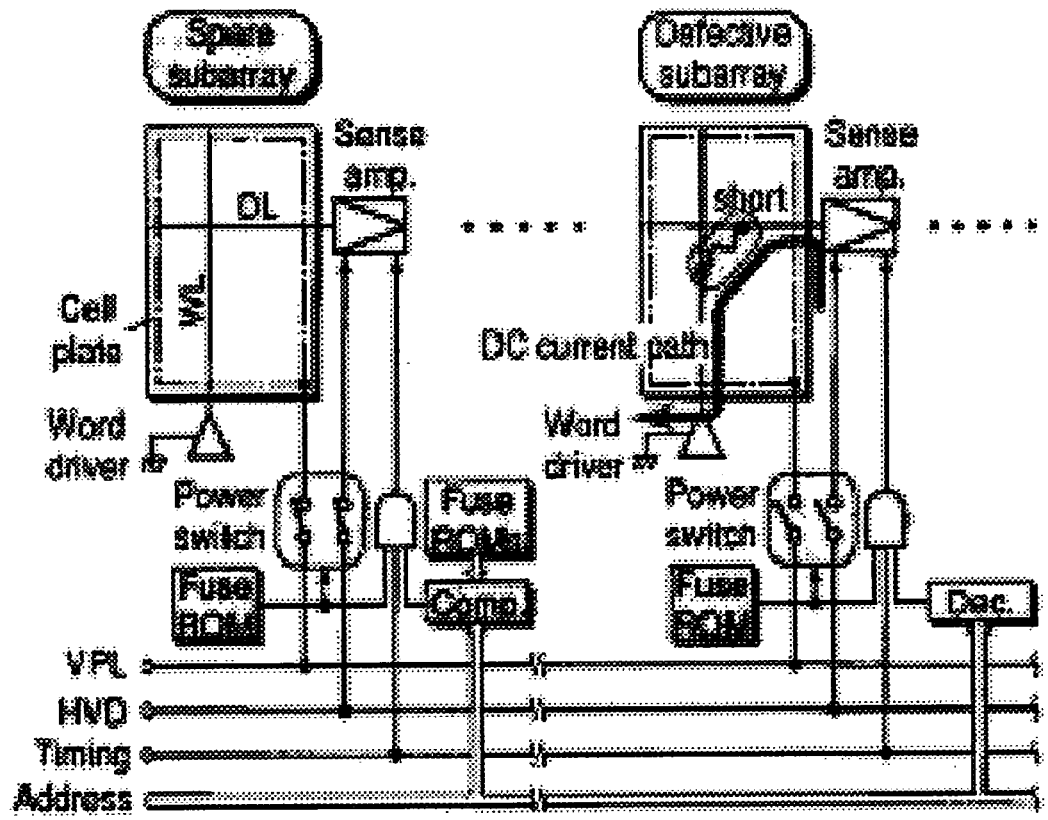
FIG. 2 is a prior art schematic diagram of a sub-array replacement redundancy scheme.

Another feature of this design is the hierarchical built-in self test (BIST) concept. With reference to FIG. 1 a central BIST circuit block 160 is provided, as known in the art, to handle BIST operation at a global level. That is, the central BIST 160 communicates with local BIST residing in each macro A1–A8 for controlling, testing and supervising purposes. The central BIST circuit block 160 controls the execution of the testing operations for all the local BIST circuits. In a normal operation, it controls the global fuse scanning by providing a scan clock and a control signal during the power-on period.

The concept of the present invention can be extended to be able to disconnect individual circuit components and/or circuits within the macros A1–A8 based on discovered faults or other reasons. For example, a DC voltage generator of a particular sub-array within a macro can be turned off, if, for example, that sub-array is found to have excessive stand-by current.

The sub-array within the macro can be turned off by cutting off a supply voltage from reaching the sub-array by providing one or more switches within the Vint power supply network 110 to regulate which components/circuits receive a voltage supply within the macro. The sub-array within the macro can then be fixed or replaced. Additionally, all of the DC generators within a particular macro can be turned off if there is a fatal fault within that macro to completely disconnect the macro from the other macros.

What has been described herein is merely illustrative of the application of the principles of the present invention. For example, the functions described above and implemented as the best mode for operating the present invention are for illustration purposes only. Other arrangements and methods may be implemented by those skilled in the art without departing from the scope and spirit of this invention.

What claimed is:

1. An integrated circuit system having a plurality of macros, said integrated circuit system comprising:
    an external voltage supply input configured for supplying an external voltage to the integrated circuit; and
    a plurality of internal voltage supply generators, each connected to a respective macro of the plurality of macros and configured for receiving the external voltage, generating an internal voltage supply, and using said generated internal voltage supply for operating its respective macro, wherein each of the plurality of internal voltage supply generators includes
    a reference supply unit for generating at least one of a voltage level and a current level,
    a voltage limiter coupled to the reference supply unit for controlling a voltage output level outputted from the voltage limiter,
    an oscillator coupled to the voltage limiter for receiving the voltage output level and generating an oscillating voltage level,
    a charge pump for receiving the oscillating voltage level for generating the internal voltage supply,
    a reference voltage generator for generating and providing a reference voltage for driving at least one voltage generator, wherein the reference voltage generator and the at least one voltage generator provide voltage to a substrate bias level voltage generator, a negative word line level voltage generator, and a boosted wordline high level voltage generator, and
    an enable register coupled to the voltage limiter, the oscillator and the charge pump, wherein the enable register is configured for storing one of an enable and disable signal, for isolating each of the plurality of macros from the external voltage supply, and for enabling or disabling at least the voltage limiter, the oscillator and the charge pump according to the stored signal.

2. The integrated circuit system as in claim 1, wherein each of the plurality of internal voltage supply generators regulate the internal voltage supply generated there from.

3. The integrated circuit system as in claim 1, wherein the external voltage is greater than the internal voltage supply.

4. The integrated circuit system as in claim 1, further comprising a scan-chain formed by a chain of scannable register latches storing fuse information and a switch enable/disable signal.

5. The integrated circuit system as in claim 1, wherein a feedback voltage is provided from the charge pump to the voltage limiter.

6. The integrated circuit system as in claim 1, wherein the external voltage drives the reference supply unit, the voltage limiter, the oscillator, and the charge pump.

7. The integrated circuit system as in claim 1, wherein the enable register stores one of an enable and a disable signal during a power-on period.

8. An integrated circuit system having a plurality of macros, said integrated circuit system comprising:
    first means for receiving an external voltage; and
    second means for generating an internal voltage supply and using said generated internal voltage supply for operating at least one of a plurality of internal voltage supply generators coupled to a respective macro of the plurality of macros, the at least one of the plurality of internal voltage supply generators is selected from the group consisting of a substrate bias level voltage generator, a negative word line level voltage generator, and a boosted wordline high level voltage generator, the second means being coupled to the first means, wherein the second means includes:

a reference supply unit for generating at least one of a voltage level and current level, a voltage limiter coupled to the reference supply unit for controlling a voltage output level outputted from the voltage limiter, an oscillator coupled to the voltage limiter for receiving the voltage output level and generating an oscillating voltage level, a charge pump for receiving the oscillating voltage level for generating the internal voltage supply, and at least one enable register coupled to the voltage limiter, the oscillator and the charge pump, wherein the at least one enable register is configured for storing an enable/disable signal, for isolating each of the plurality of macros from the external voltage, and for enabling or disabling at least the voltage limiter, the oscillator and the charge pump according to the stored enable/disable signal.

9. The integrated circuit system as in claim 8, further comprising a scan-chain formed by a chain of scannable register latches storing fuse information and the enable/disable signal.

10. The integrated circuit system as in claim 8, wherein the second means comprise a reference voltage generator for generating and providing a reference voltage for driving at least one voltage generator.

11. The integrated circuit system as in claim 10, wherein the reference voltage generator and the at least one voltage generator provide voltage to the at least one of the plurality of internal voltage supply generators.

12. The integrated circuit system as in claim 8, wherein a feedback voltage is provided from the charge pump to the voltage limiter.

13. The integrated circuit system as in claim 8, wherein the external voltage drives the reference supply unit, the voltage limiter, the oscillator, and the charge pump.

14. The integrated circuit system as in claim 8, wherein at least one enable register stores the enable/disable signal during a power-on period.

15. The integrated circuit system as in claim 8, further comprising means for performing a built-in self test for testing the DC voltage generator system.

* * * * *